(12) United States Patent
Lin et al.

(10) Patent No.: US 8,017,964 B2
(45) Date of Patent: Sep. 13, 2011

(54) LIGHT EMITTING DEVICE

(75) Inventors: Ming-Te Lin, Hsinchu (TW); Ming-Yao Lin, Hsinchu (TW); Chia-Chang Kuo, Hsinchu (TW); Sheng-Pan Huang, Hsinchu (TW); Wen-Yung Yeh, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/487,651

(22) Filed: Jun. 19, 2009

(65) Prior Publication Data
US 2009/0250717 A1 Oct. 8, 2009

Related U.S. Application Data

(62) Division of application No. 11/429,235, filed on May 8, 2006, now abandoned.

(30) Foreign Application Priority Data

Sep. 28, 2005 (TW) ................................ 94133671 A

(51) Int. Cl.
*H01L 29/22* (2006.01)
*H01L 29/227* (2006.01)
(52) U.S. Cl. .............................. 257/98; 257/99; 257/100
(58) Field of Classification Search .................... 257/81, 257/82, 98–100, E33.058, E33.059, E33.06, 257/E33.061
See application file for complete search history.

(56) References Cited

U.S. PATENT DOCUMENTS
7,091,653 B2 *  8/2006  Ouderkirk et al. ............ 313/113

FOREIGN PATENT DOCUMENTS
| JP | 2000-006467 | 1/2000 |
| JP | 2002-134793 | 5/2002 |
| JP | 2004-055168 | 2/2004 |
| JP | 2005-101665 | 4/2005 |

* cited by examiner

*Primary Examiner* — Hung Vu
(74) *Attorney, Agent, or Firm* — Jianq Chyun IP Office

(57) ABSTRACT

A light emitting device includes a light emitting element having at least two electrodes disposed at the side of the light output surface thereof; and a base member having a recess and lead portions corresponding to the electrodes, the light emitting element being mounted on the base member and received in the recess, wherein the light output surface faces toward opening of the recess that becomes smaller while approaching the light output surface, and the electrodes are respectively in electrical connection with the lead portions that extend from the connection positions to outer edge of the base member for power connection, and a light reflecting portion is disposed in the recess adjacent to the light output surface such that the light emitted from the light emitting element can be reflected to walls of the recess to form a substantially collimated light beam so as to improve light efficiency.

16 Claims, 12 Drawing Sheets

LIGHT EMITTING DEVICE

CROSS-REFERENCE TO RELATED APPLICATION

This is a divisional application of patent application Ser. No. 11/429,235, filed on May 8, 2006, which claims the priority benefit of Taiwan patent application serial no. 94133671, filed on Sep. 28, 2005. The entirety of each of the above-mentioned patent applications is hereby incorporated by reference herein and made a part of this specification.

BACKGROUND

1. Technical Field

The present disclosure relates to a light emitting device, and more particularly to a light emitting device that can be applied to high power light emitting diodes.

2. Description of Related Art

Currently, light emitting diodes (LEDs) that are characterized by long lifetime, small volume, low heat dissipation, low power consumption, fast response speed and single color light emission are widely used in indicator lights, bill boards, traffic lights, auto lamps, display panels, communication tools, consumer electronics and so on. Accordingly, different packaging techniques are developed for LEDs packaging, which results in different package structures of LEDs.

FIGS. 1(A) to 1(C) show a flip chip packaging process. As shown in FIG. 1(A), a plurality of conductive bumps 11 is formed on an aluminum substrate 10. Then, as shown in FIG. 1(B), an LED chip 12 is attached to the aluminum substrate 10 upside down. Finally, underfill and package processes are performed and a final package structure is shown in FIG. 1(C).

FIGS. 2(A) to 2(C) show a wire bonding packaging process. As shown in FIG. 2(A), an aluminum substrate or ceramic substrate 20 is coated with silver paste 21. Then, as shown in FIG. 2(B), a flip chip LED chip device 22 is attached to the substrate and wire bonding process is performed. Subsequently, underfill and package processes are performed and a final package structure is shown in FIG. 2(C).

In the above two packaging processes, because the molding compound and the substrate have different expansion factors, deformation and stripping are easy to happen. In addition, since the LED chip is electrically connected to the outside through the aluminum or ceramic substrate, the conductive path is very long, which results in too much heat absorption by the aluminum or ceramic substrate, thereby making the mass production difficult. Furthermore, if several chip products are applied to the aluminum or ceramic substrate, the aluminum or ceramic substrate becomes so weak that it needs to be processed before the reflow process.

FIGS. 3(A) to 3(C) and FIGS. 4(A) to 4(C) show two packaging processes which respectively use lead frames 30 and 40 and heat sinks 31 and 41. As shown in FIGS. 3(A) and 4(A), the heat sinks 31 and 41 located on the lead frames 30 and 40 are respectively coated with silver paste 32 and 42. As shown in FIGS. 3(B) and 4(B), flip chip LED chip devices 33 and 43 are respectively attached to the lead frames 30 and 40. Afterwards, a wire bonding process is performed. Subsequently, the underfill and package processes are performed and final package structures are shown in FIGS. 3(C) and 4(C).

In the above two packaging processes, high series thermal resistance may lead to reliability problem. Further, since the stack technique is used in the above two packaging processes, the packaged products may become very thick. To facilitate processes that are performed from the front side of the package structure, the depth of the recess must be shallow (as shown in FIGS. 4(A) to 4(C)). However, such a shallow recess would affect light collecting efficiency.

FIGS. 5(A) to 5(C) and FIGS. 6(A) to 6(C) show two packaging processes which use ceramic substrates and injection molded lead frames. It should be noted that an aluminum substrate must be further attached to the ceramic substrate. Thus, rather high cost of the ceramic substrate and addition of the aluminum substrate may result in higher fabrication cost. In addition, as shown in FIGS. 6(A) to 6(C), injection molding technique may result in high series thermal resistance of light emitting device. Accordingly, the light emitting device can not be used in high power LED package. As described above in FIGS. 4(A) to 4(C), there also may exist the problem of bad light collecting efficiency.

Accordingly, there is a need to develop a low thickness LED package structure which has low series thermal resistance and low packaging and application cost and can improve light collecting efficiency.

SUMMARY

The present disclosure discloses a light emitting device, at least comprising: a light emitting element with at least two electrodes disposed at the side of the light output surface thereof; and a base member having a recess and lead portions corresponding to the electrodes, the light emitting element being mounted on the base member and received in the recess, wherein the light output surface faces toward opening of the recess that becomes smaller while approaching the light output surface, and the electrodes are respectively in electrical connection with the lead portions that extend from the connection positions to outer edge of the base member for power connection, and a light reflecting portion is disposed in the recess adjacent to the light output surface such that the light emitted from the light emitting element can be reflected to walls of the recess to form a substantially collimated light beam; and a thermal conductor attached to a surface of the light emitting element opposite to the light output surface for heat dissipation.

DETAILED DESCRIPTION

Hereunder, embodiments of the present disclosure will be described in full detail with reference to the accompanying drawings.

FIGS. 7(A) to 7(E) are diagrams showing detailed structure of a light emitting device according to the present disclosure. The light emitting device of the present disclosure at least includes a light emitting element 60 (shown in FIG. 7(A)) and a base member 61 (shown in FIG. 7(B)) to which the light emitting element 60 can be mounted.

Figure 1A:
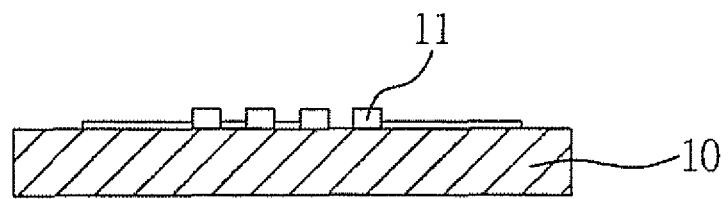
FIGS. 1(A) to 1(C) are diagrams illustrating a first light emitting diode package structure according to the prior art.
Figure 1B:
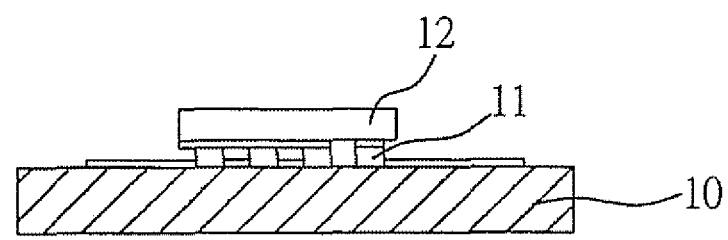
Figure 1C:
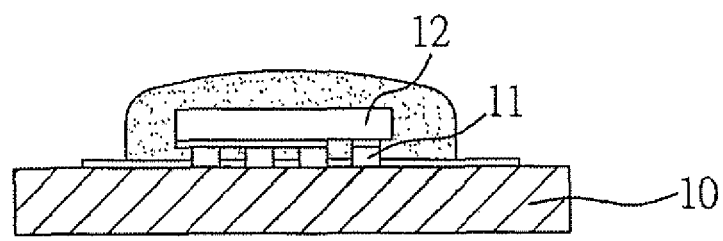
Figure 2A:
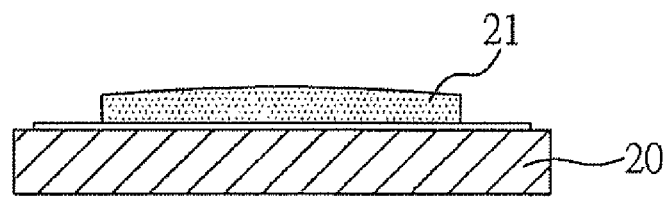
FIGS. 2(A) to 2(C) are diagrams illustrating a second light emitting diode package structure according to the prior art.
Figure 2B:
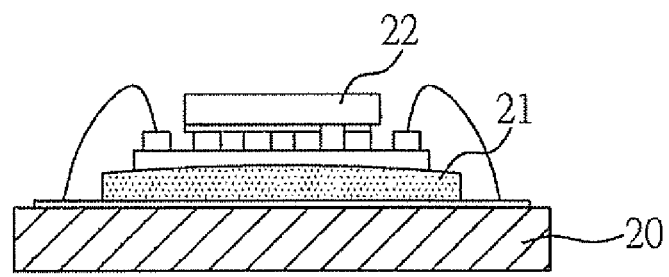
Figure 2C:
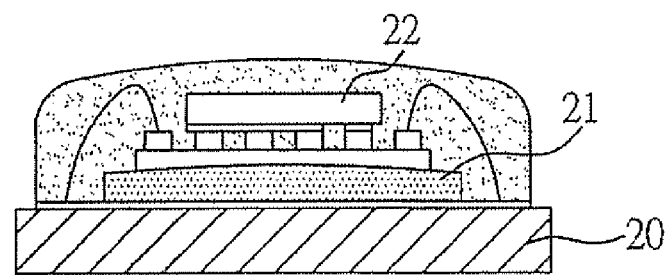
Figure 3A:
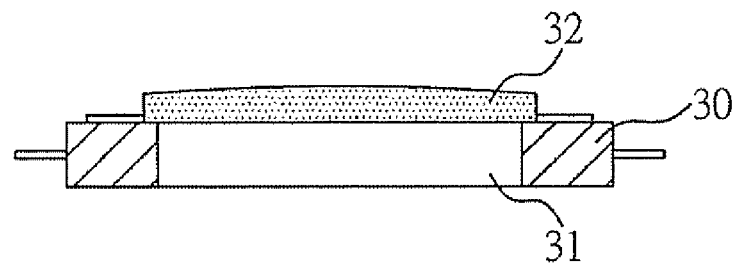
FIGS. 3(A) to 3(C) are diagrams illustrating a third light emitting diode package structure according to the prior art.
Figure 3B:
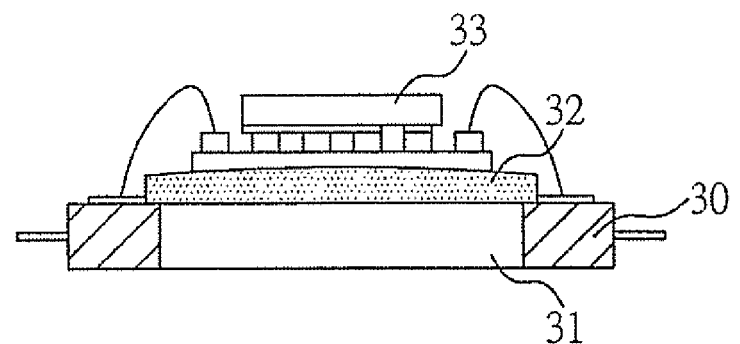
Figure 3C:
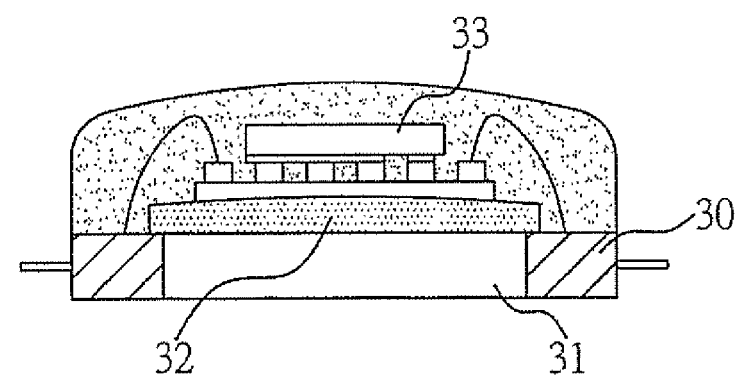
Figure 4A:
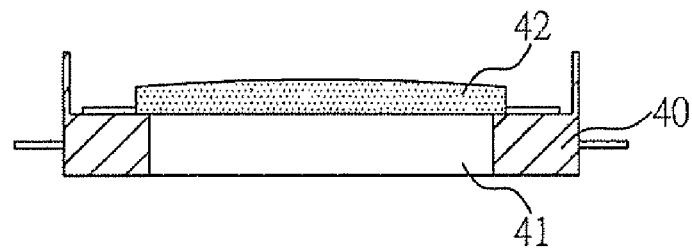
FIGS. 4(A) to 4(C) are diagrams illustrating a fourth light emitting diode package structure according to the prior art.
Figure 4B:
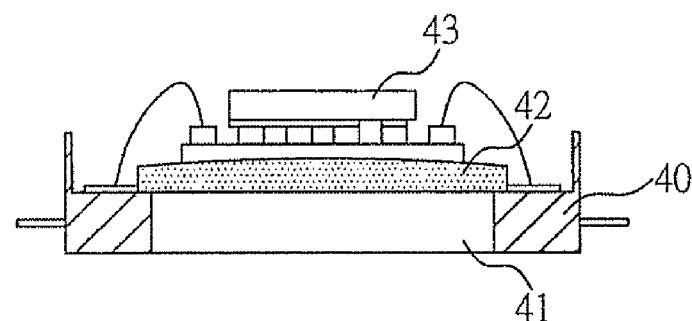
Figure 4C:
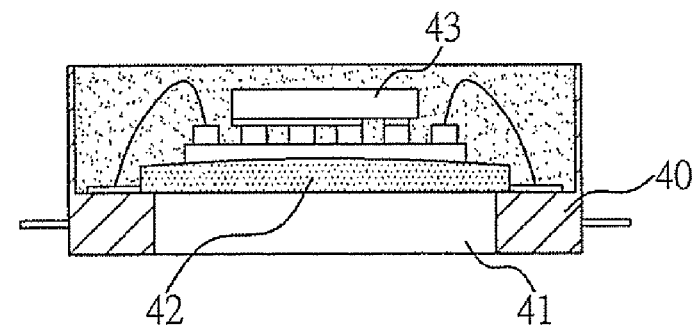
Figure 5A:
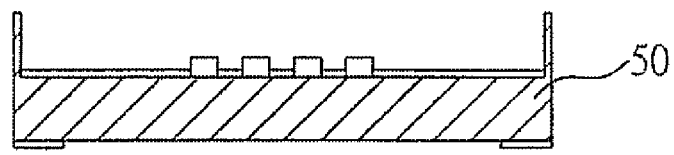
FIGS. 5(A) to 5(C) are diagrams illustrating a fifth light emitting diode package structure according to the prior art.
Figure 5B:
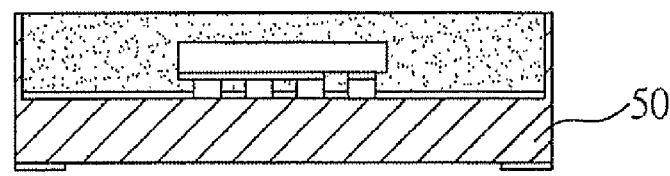
Figure 5C:
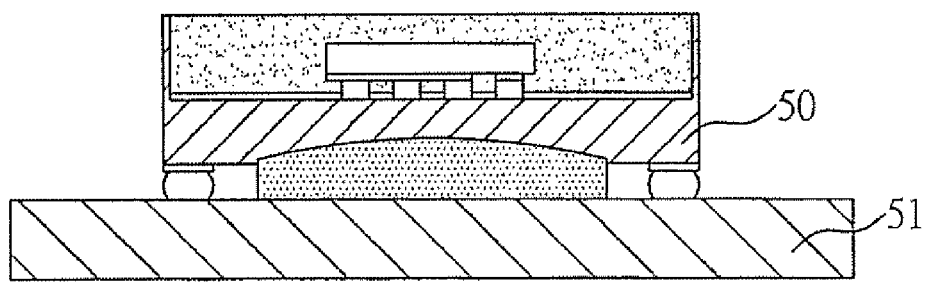
Figure 6A:
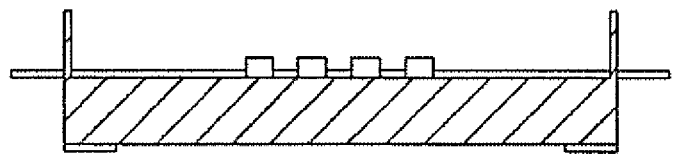
FIGS. 6(A) to 6(C) are diagrams illustrating a sixth light emitting diode package structure according to the prior art.
Figure 6B:
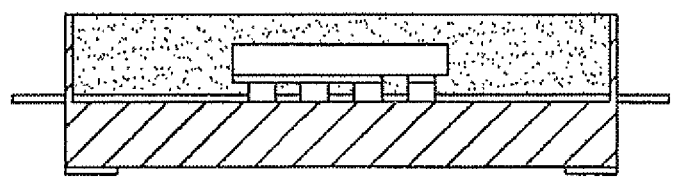
Figure 6C:
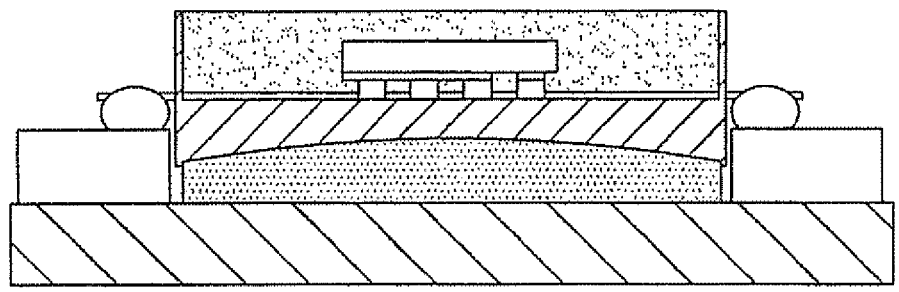
Figure 7A:
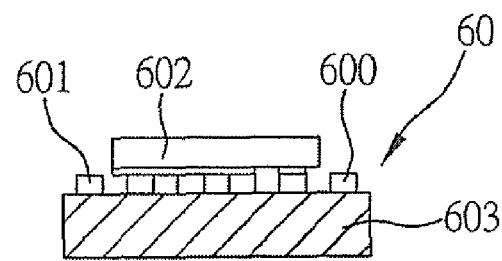
FIGS. 7(A) to 7(E) are diagrams illustrating detailed exemplary structure of a light emitting device, consistent with disclosed embodiments.

As shown in FIG. 7(A), the light emitting element 60 has at least two electrodes 600 and 601 disposed at the side of the light output surface of the light emitting element 60 for power connection. Preferably, the light emitting element 60 includes at least one light emitting chip 602 and at least one substrate 603 provided with electrodes 600 and 601 for power connection. The light emitting chip 602 in a flip chip configuration is mounted to the substrate 603 and electrically connected with the substrate 603 via gold balls, tin balls or any electrically and thermally conductive material. Preferably, the substrate 603 is formed of Si, Al, or C.

Figure 7B:
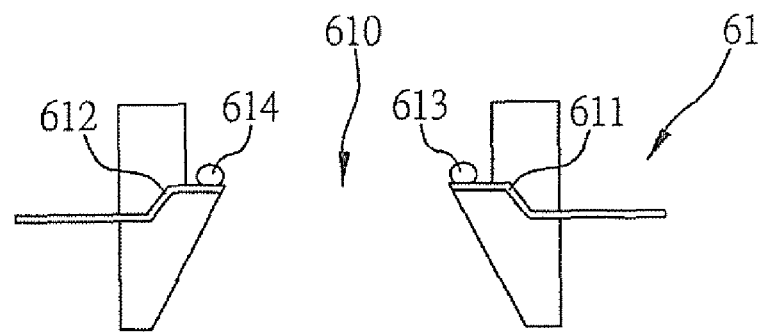

As shown in FIG. 7(B), the base member 61 is a lead frame formed of PPA resin, PC thermoplastic material or any insulating material by injection molding or assembly. The base member 61 has a recess 610 in which the light emitting element 60 can be received with its light output surface facing toward opening of the recess 610, the opening of the recess 610 becoming smaller while approaching the light output surface. In addition, two lead portions 611 and 612 are disposed on the base member 61 to electrically connect electrodes 600 and 601 of the light emitting element 60. In the present embodiment, the lead portions 611 and 612 are coated with conductive adhesives 613 and 614 to fix the electrodes 600 and 601 to the lead portions 611 and 612 and provide electrical connection between them. Preferably, the conductive adhesives 613 and 614 are formed of silver paste, solder paste or solder paste containing lead. The above lead portions and electrodes can also be fixed and electrically connected via gold balls or tin balls by using flip chip technology, or through conductive bonding material by using ultrasonic bonding technology. The lead portions 611 and 612 extend from the electrically connecting positions of the light emitting element 60 and the base member 61 to outer edge of the base member 61 for power connection. The lead portions are formed of electrically conductive conductor such as Au, Ag, Cu, Sn, Al or the like.

Figure 7C:
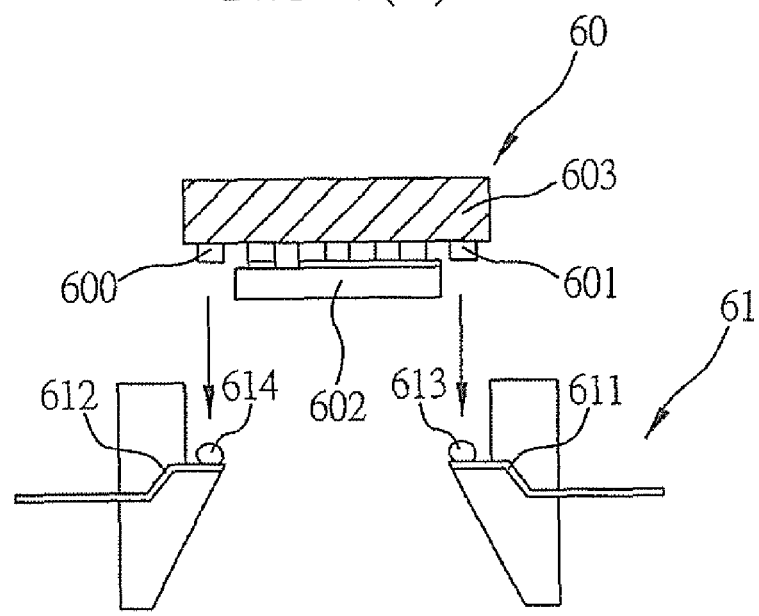
Figure 7D:
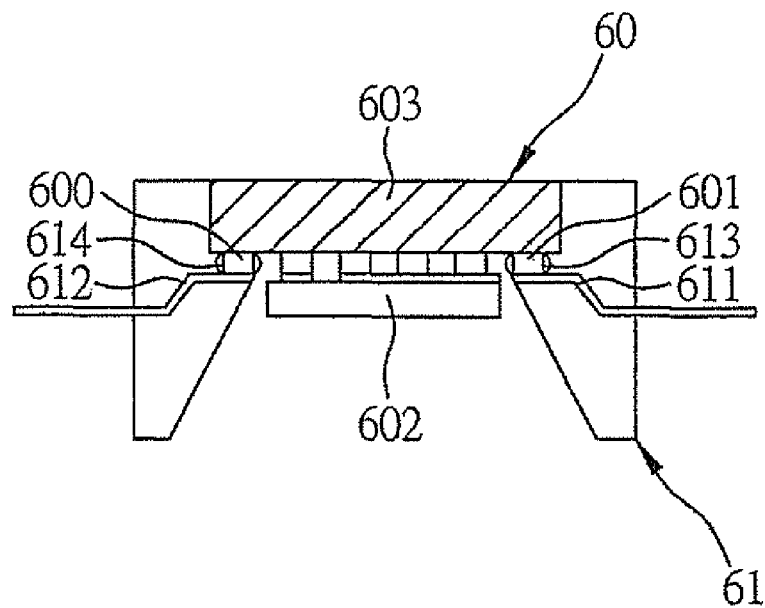
Figure 7E:
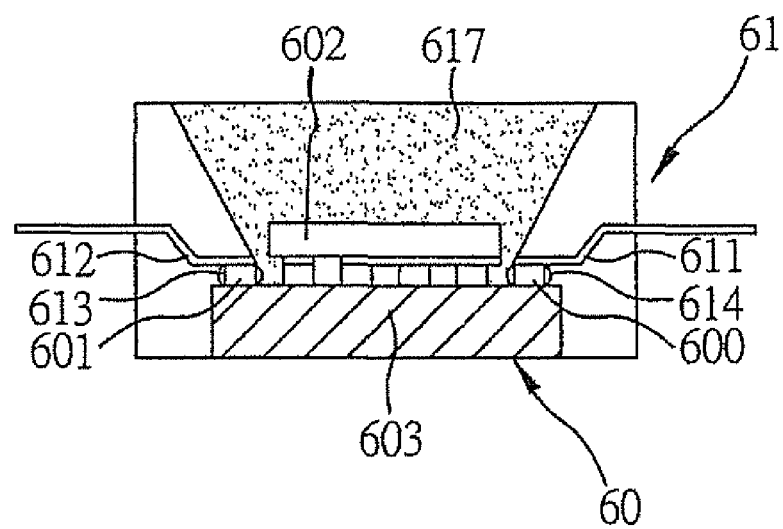
Figure 8A:
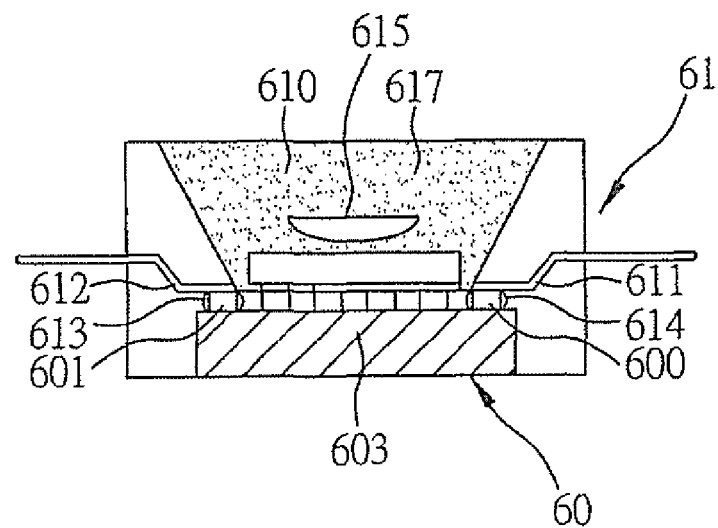
FIGS. 8(A) to 8(B) are diagrams illustrating two other structures of a light emitting device, consistent with disclosed embodiments.

As shown in FIG. 7(C), the light emitting element 60 is attached to the base member 61 in the arrow direction by the conductive adhesives 613 and 614, thereby forming a structure as shown in FIG. 7(D). Then, underfill and package processes are performed to fill the recess 610 with sealing member 617 so as to fix the light emitting element 60 to the base member 61. The final structure of the light emitting device is shown in FIG. 7(E). It should be noted that although the sealing member in FIG. 7(E) forms a flat plane at the light output surface, it is not limited thereto. The sealing member can have a lens shape or the like to improve light collecting efficiency. In addition, as shown in FIG. 8(A), a light reflecting portion 615 can be disposed in the recess adjacent to the light output surface to reflect the light beam emitted from the light emitting element 60 to walls of the recess 610, which further reflect the light to form a substantially collimated light beam to improve the light efficiency. The light reflecting portion 615 is fixed by the sealing member 617 as described above. Preferably, the light reflecting portion 615 is formed of reflective material by electroplating or assembling.

Figure 8B:
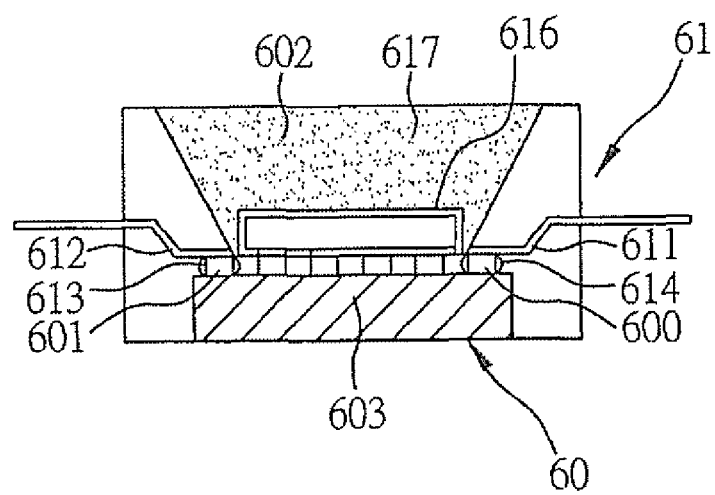

As shown in FIG. 8(B), a light converting portion 616 is disposed in the recess adjacent to the light output surface to change the wavelength of the light emitted from the light emitting element 60, thereby improving light efficiency. The light converting portion 616 is fixed by the sealing member 617 as described above and formed of fluorescent converting material by coating.

Figure 9A:
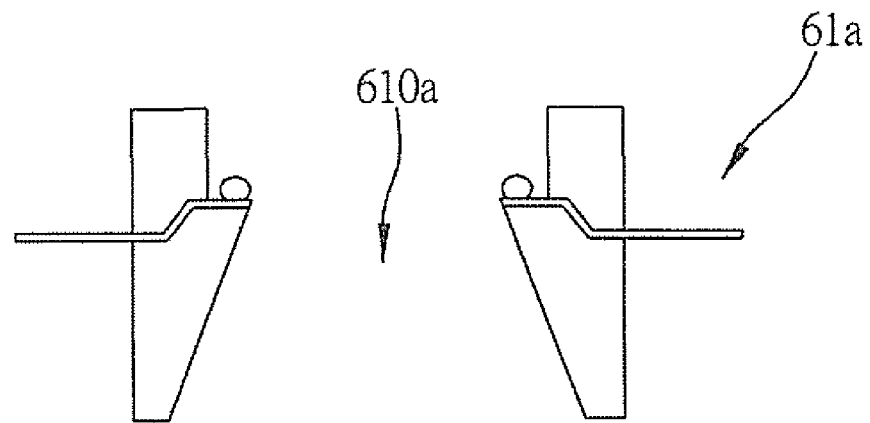
FIGS. 9(A) to 9(B) are diagrams respectively illustrating structure of a base member having a deeper recess and structure of a light emitting device comprising such a base member, consistent with disclosed embodiments.
Figure 9B:
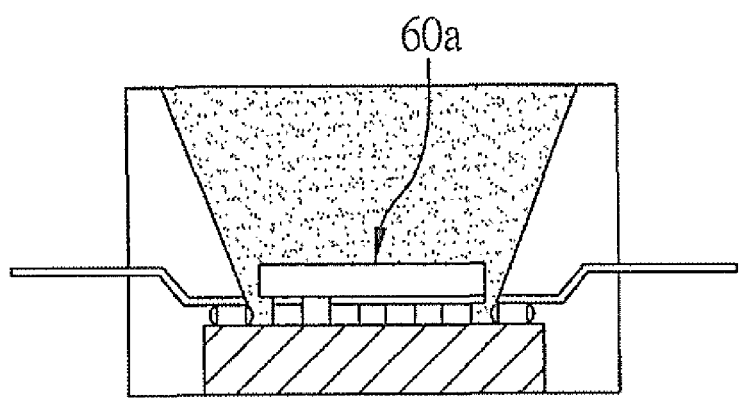

As shown in FIG. 9(A), since the base member 61a has a thin thickness, the depth of the recess 610a can be increased to improve light collecting efficiency. As shown in FIG. 9(B), the light emitting element 60a is fixed to the base member 61a by underfill and package. Thus, compared with the prior art, the thickness of the light emitting device of the present disclosure becomes much thinner, thereby reducing the fabrication cost. On the other hand, even if the light emitting device of the present disclosure has same thickness as that of the prior art, the depth of the recess 610a can be increased to achieve better light collecting efficiency.

Figure 10:
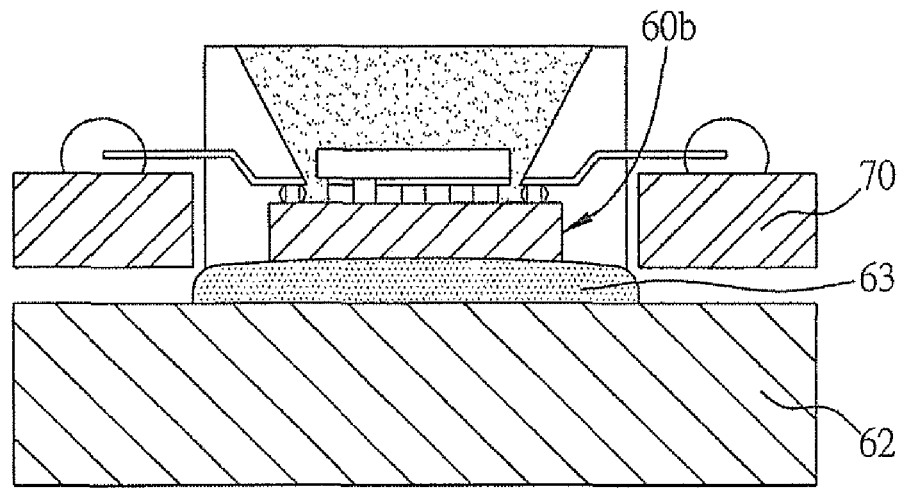
FIG. 10 is a side sectional view of another exemplary light emitting device, consistent with disclosed embodiments.

To solve the heat dissipating problem of the light emitting device, the present disclosure proposes another embodiment, as shown in FIG. 10. The surface of the light emitting element 60b opposite to the light output surface is mounted with a thermal conductor 62 such that the heat generated by the light emitting element 60b can be dissipated efficiently when the light emitting element 60b is connected to the power. In FIG. 10, printed circuit board 70 is used to supply power. Preferably, the thermal conductor 62 of a plate shape is formed of Al, Cu, Fe or material having a thermal conductivity of at least 50 W/mK. Furthermore, an adhesive layer 63 can be disposed between the thermal conductor 62 and the light emitting element 60b to fix the light emitting element 60b to the surface of the thermal conductor 62. Preferably, the adhesive layer 63 is formed of heat sink paste. Thus, by separating the thermally conductive structure from the electrically conductive structure, the present disclosure decreases the conductive path, thereby decreasing series thermal resistance and increasing reliability of products.

Figure 11:
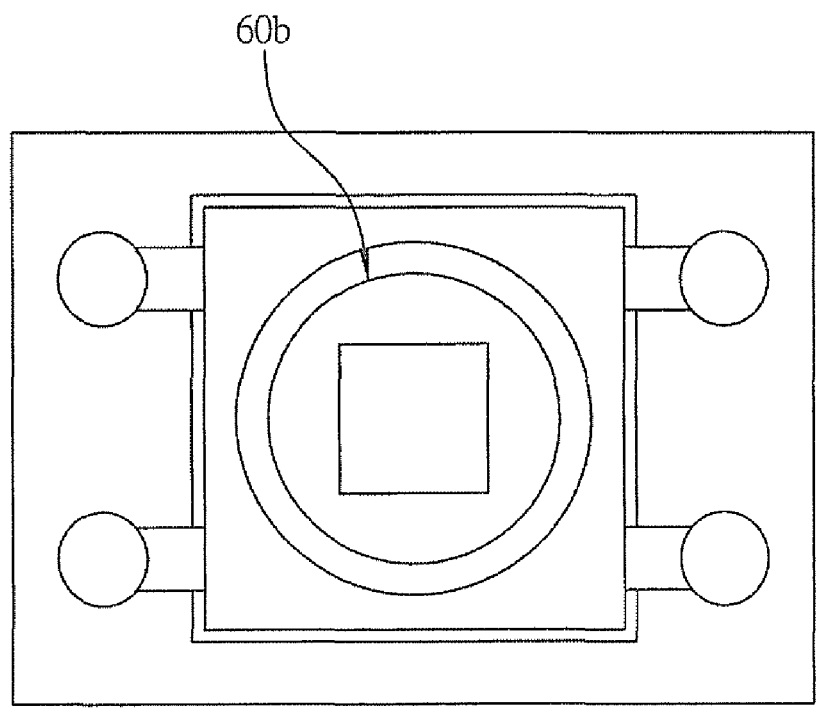
FIG. 11 is a plan view of the light emitting device of FIG. 10.
Figure 12:
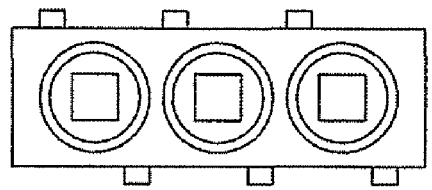
FIG. 12 to 14 are plan views illustrating other exemplary light emitting devices, consistent with disclosed embodiments.
Figure 13:
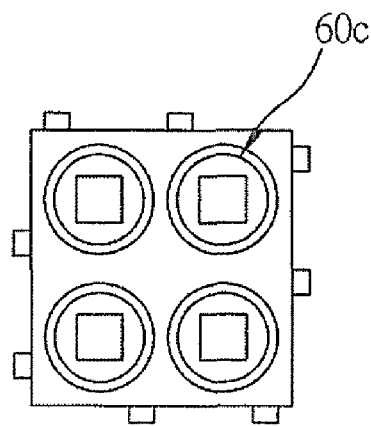
Figure 14:
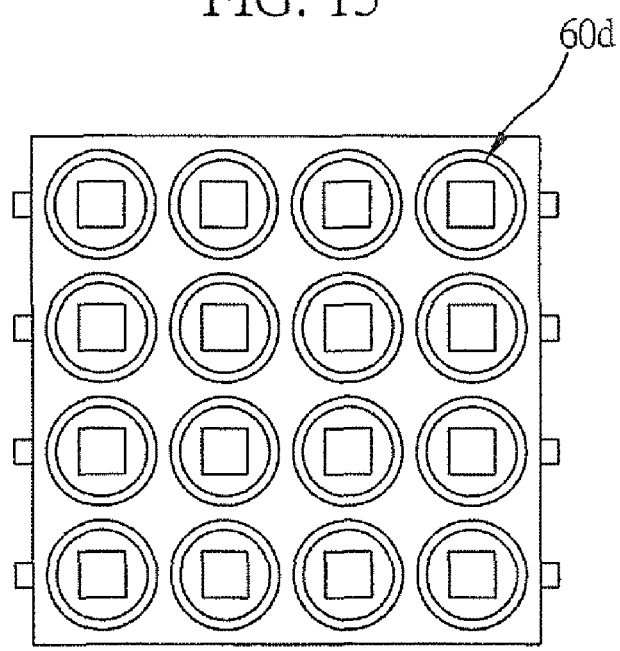

FIG. 11 is a plan view of the light emitting device in FIG. 10. As shown in FIG. 11, the light emitting element 60b comprises a single chip emitting single color. However, the light emitting element 60b is not limited thereto. As shown in FIG. 12, the light emitting element 60b could be composed of multiple chips, which outputs single color by light mixing. Alternatively, as shown in FIGS. 13 and 14, light emitting elements 60c and 60d respectively include multiple chips which emit light alternately to output multi-color light source for application. In addition, the light element could emit ultraviolet.

Therefore, the light emitting device of the present disclosure at least includes a light emitting element having at least two electrodes located at the side of the light output surface thereof and a base member to which the light emitting element can be mounted. Therein, the light emitting element is received in a recess of the base member with its light output surface facing toward the opening of the recess that gradually decreases while approaching the light output surface and the electrodes of the light emitting elements are electrically connected with lead portions of the base member that extend toward the outer edge of the base member for power connection. As a result, the present disclosure achieves a light emitting device of thin thickness, which accordingly has advantages of short current path, low series thermal resistance and low cost. In addition, the depth of the recess can be increased to improve light collecting efficiency, which is not limited to the depth of 6 mm as in the prior art. Further, compared with the prior art that only can mount the light emitting element from the front side of the base member, since a hollow base member is used in the present disclosure, the light emitting element can be mounted into the recess from the back side of the base member, thereby facilitating the mounting process.

The disclosure has been described using exemplary embodiments. However, it is to be understood that the scope of the disclosure is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A light emitting device, comprising:
   a light emitting element having at least two electrodes disposed at the side of the light output surface thereof;
   a base member having a recess and lead portions corresponding to the electrodes, the light emitting element being mounted on the base member and received in the recess, wherein the light output surface faces toward opening of the recess that becomes smaller while approaching the light output surface, and the electrodes are respectively in electrical connection with the lead portions that extend from the connection positions to outer edge of the base member for power connection, and a light reflecting portion is disposed in the recess and disposed directly above the light output surface of the light emitting element such that the light emitted from the light emitting element is reflected to walls of the recess to form a substantially collimated light beam, the recess being filled with sealing member to fix the light reflecting portion and the light emitting element to the base member; and
   a thermal conductor attached to a surface of the light emitting element opposite to the light output surface for heat dissipation.

2. The light emitting device of claim 1, wherein the light emitting element comprises at least one substrate provided with electrodes for power connection and at least one light emitting chip mounted on the substrate and electrically connected with the substrate.

3. The light emitting device of claim 2, wherein the light emitting element comprises one of the group consisting of single color single chip, single color multi-chip, multi-color multi-chip and chip(s) emitting ultraviolet light.

4. The light emitting device of claim 2, wherein the light emitting chip in a flip-chip configuration is electrically connected with the substrate via one of the group consisting of gold balls, tin balls and electrically and thermally conductive material.

5. The light emitting device of claim 2, wherein the light emitting chip is an LED chip.

6. The light emitting device of claim 2, wherein the substrate is made of one of the group consisting of Si, Al and C.

7. The light emitting device of claim 1, wherein the base member is a lead frame.

8. The light emitting device of claim 7, wherein the lead frame is mainly formed of one of the group consisting of PPA resin, PC thermoplastic material and insulating material.

9. The light emitting device of claim 1, wherein the lead portions are formed of electrically conductive conductor.

10. The light emitting device of claim 9, wherein the conductor is one of the group consisting of Au, Ag, Cu, Sn, Al and conductive material.

11. The light emitting device of claim 1, wherein the lead portions are further electrically connected with the electrodes of the light emitting element through one of the group consisting of conductive adhesive, gold balls, tin balls and conductive bonding material.

12. The light emitting device of claim 11, wherein the conductive adhesive is one of the group consisting of silver paste, solder paste and solder paste containing lead.

13. The light emitting device of claim 1, wherein the sealing member forms a lens shape at the light output surface of the light emitting element to improve light collecting efficiency.

14. The light emitting device of claim 1, wherein the thermal conductor is formed of one of the group consisting of Al, Cu, Fe and material having a thermal conductivity of at least 50 W/mK.

15. The light emitting device of claim 1, wherein an adhesive layer is further disposed between the thermal conductor and the light emitting element.

16. The light emitting device of claim 15, wherein the adhesive layer is formed of heat sink paste.

* * * * *